(12) United States Patent
Wuu et al.

(10) Patent No.: US 6,222,214 B1
(45) Date of Patent: Apr. 24, 2001

(54) PLUG STRUCTURE AND PROCESS FOR FORMING STACKED CONTACTS AND METAL CONTACTS ON STATIC RANDOM ACCESS MEMORY THIN FILM TRANSISTORS

(75) Inventors: Shou-Gwo Wuu; Mong-Song Liang; Chung-Hui Su, all of Hsin-chu; Chen-Jong Wang, Hsin Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 904 days.

(21) Appl. No.: 08/630,111

(22) Filed: Apr. 8, 1996

Related U.S. Application Data

(62) Division of application No. 08/429,725, filed on Apr. 27, 1995, now Pat. No. 5,547,892.

(51) Int. Cl.[7] .................................................. H01L 27/108
(52) U.S. Cl. .............................................. 257/296; 257/71
(58) Field of Search ................... 257/57, 68, 71, 257/296

(56) References Cited

U.S. PATENT DOCUMENTS

| | | | |
|---|---|---|---|
| 4,639,274 | * 1/1987 | Krishna | 257/296 |
| 4,980,732 | 12/1990 | Okazawa | 357/23.5 |
| 5,173,753 | * 12/1992 | Wu | 257/9 |
| 5,371,398 | * 12/1994 | Nishihara | 257/57 |

FOREIGN PATENT DOCUMENTS

603622 * 6/1994 (EP) ........................................ 257/57

* cited by examiner

*Primary Examiner*—Roy Potter
(74) *Attorney, Agent, or Firm*—George O. Saile; Stephen B. Ackerman

(57) ABSTRACT

A method for fabricating a novel plug structure for low resistance ohmic stacked contacts and at the same time forming metal contacts to devices on a SRAM cell was achieved. The method involved forming electrically conductive plugs in the stacked contact openings to form ohmic connections between a P+ doped polysilicon layer and a N+ doped polysilicon layer and thereby increasing the on current ($I_{on}$) of the SRAM cell. The electrical conductive plugs are also simultaneously formed in metal contact openings to devices areas elsewhere on the substrate. The process for the plug structure also reduces the mask set by one masking level over the prior art process.

5 Claims, 3 Drawing Sheets

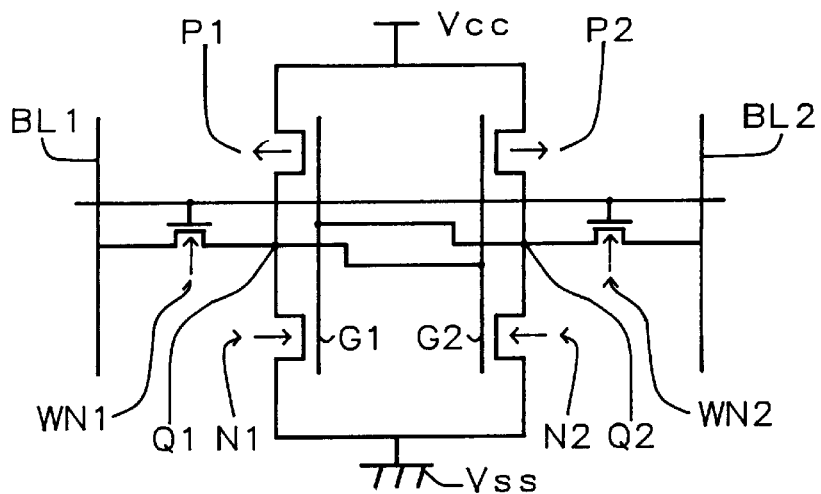
FIG. 1 − Prior Art
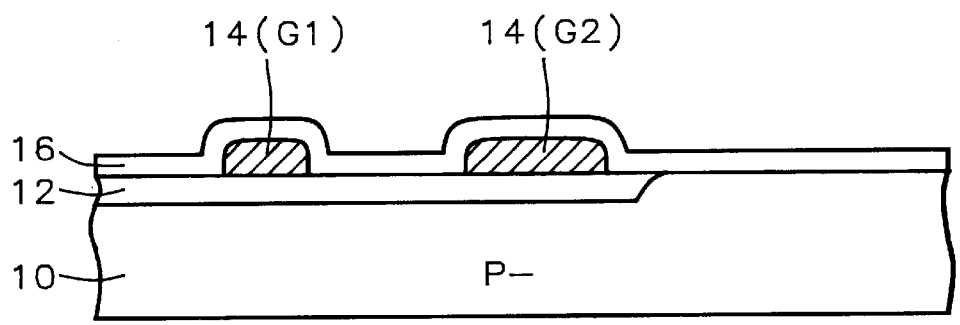
FIG. 2 − Prior Art
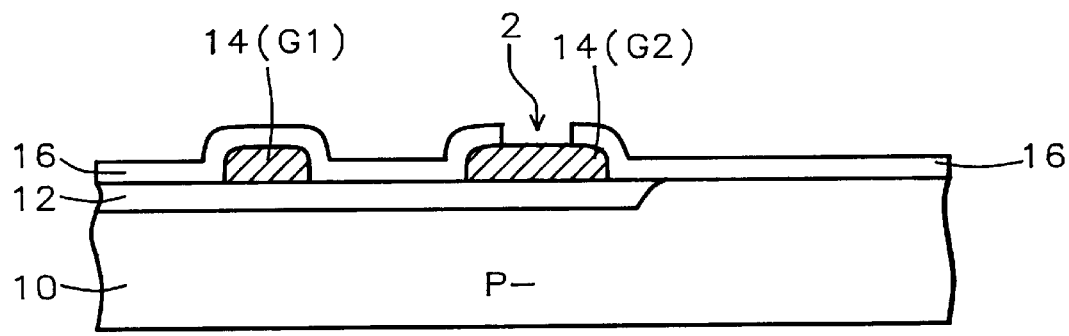
FIG. 3 − Prior Art

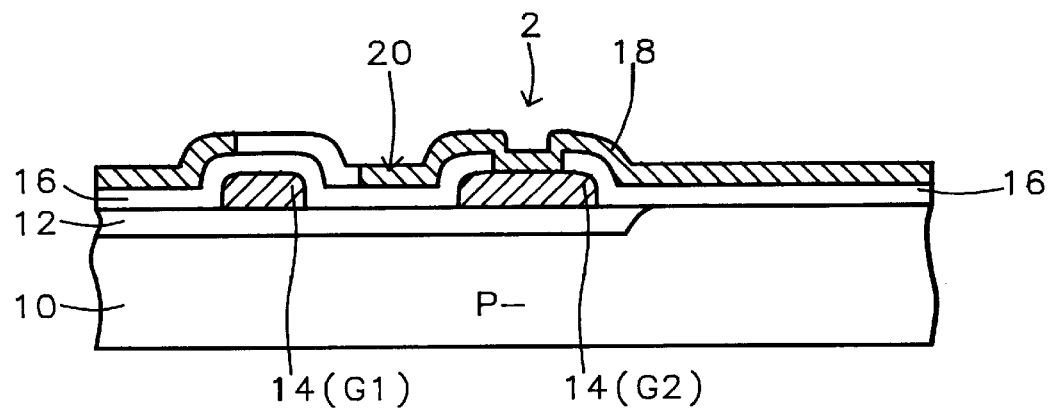
FIG. 4 – Prior Art
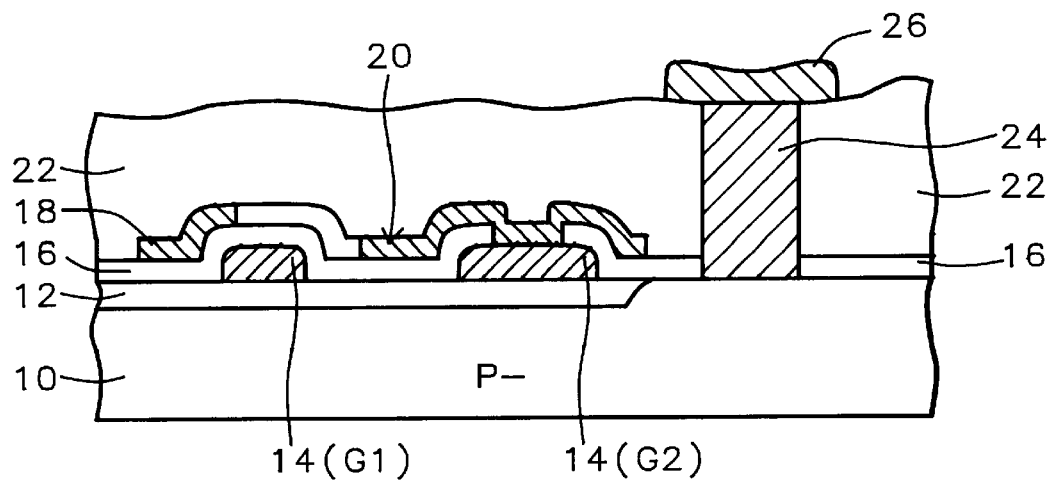
FIG. 5 – Prior Art
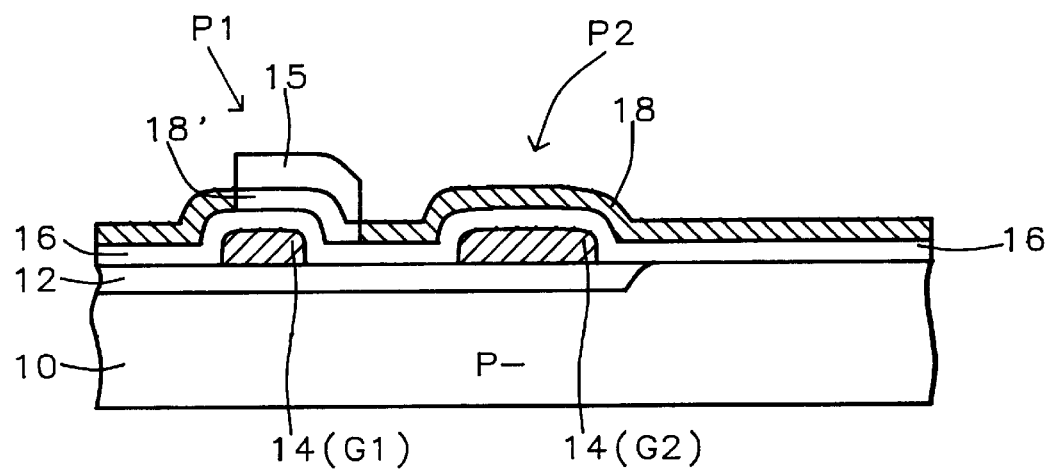
FIG. 6

US 6,222,214 B1

PLUG STRUCTURE AND PROCESS FOR FORMING STACKED CONTACTS AND METAL CONTACTS ON STATIC RANDOM ACCESS MEMORY THIN FILM TRANSISTORS

This is a division of application Ser. No. 08/429,725, filed Apr. 27, 1995, now U.S. Pat. No. 5,547,892.

BACKGROUND OF THE INVENTION

1. Field of the Invention

The present invention relates to integrated circuits on semiconductor substrates, and more particularly to the fabrication of ohmic contacts relating to Thin Film Transistors (TFT) on Static Random Access Memory (SRAM).

2. Description of the Prior Art

Random Access Memory (RAM) is used extensively in the electronics industry for storing data for digital systems, such as computers. The major types of RAMs, are the Dynamic Random Access Memory (DRAM) and the Static Random Access Memory (SRAM). The individual DRAM cells, composed of a single transistor and capacitor store information on the capacitors as charge. In general the DRAM is slower than the SRAM and needs to be refreshed periodically to maintain the charge on the capacitor, but is considerably cheaper to produce per bit of information stored than the SRAM. The SRAM cell, on the other hand, is usually composed of six transistors and functions as a static latch or flip flop circuit, does not have to be refreshed and is much faster than the DRAM. Because of its speed the SRAM is ideal for use as a cache or buffer memory to speed up the system performance.

A circuit schematic for a typical six-transistor CMOS SRAM cell is shown in FIG. 1. Only one of the array of many cells is shown in FIG. 1. The trend in recent years is to fabricate the CMOS SRAMs using a P channel Thin Film Transistor (TFT) for the P1 and P2 transistors to reduce the size of the cell and the cost of the chip. For example, T. Okazawa, U.S. Pat. No. 4,980,732 teaches a method for making TFTs with lower off currents. In that patent the FET drain side of channel is off set from the gate electrode to reduce the current. Briefly, the SRAM cell functions as follows. Referring to FIG. 1, an applied gate voltage on the word line WL switch on the pass transistors WN1 and WN2. The voltage at the nodes Q1 and Q2 between the two pairs of CMOS transistor P1, N1 and P2, N2, are sensed on the bit lines BL1 and BL2 during the read cycle to determine the state of the SRAM latch. During the write cycle an impressed voltage on the bit lines can switch the voltage levels on the latch and thereby change the stored binary data representing one's and zero's.

However, during fabrication of the SRAM cell the nodes Q1 and Q2 between each pair of CMOS P-channel and N-channel FETs must, respectively, make good electrical contact to the gate electrodes G2 and G1, as shown in the circuit schematic of FIG. 1. Unfortunately, when the P-channel TFT are built on the semiconductor substrate by methods of the prior art, a number of additional processing problems occur that limit the performance and reliability of the SRAM.

These problems are best understood by referring to the conventional prior art process for forming the P-type TFT, as shown in schematic cross-sectional views in FIGS. 2 through 5. In order to simplify the discussion only portions of the substrate for the SRAM cell is shown on which the P-channel TFT is built. The other circuit elements, such as the WN1, WN2 FETs and the word line formed from a first polysilicon layer and the bit lines formed from a second polysilicon layer are not shown in FIGS. 2 through 5.

After completing portions of the word line and bit line structure on substrate 10, the latch circuits of the SRAM memory cells are formed having the P-channel TFTs on portions of the substrate within the array of word and bit lines. Referring now to FIG. 2, the TFT gate electrodes G1 and G2 are patterned from an $N^+$ doped third polysilicon layer 14. A thin gate oxide 16 is then deposited over the gate electrodes, also shown in FIG. 2. A contact opening 2 is then formed in the gate oxide to the second gate G2 (see FIG. 3) by photoresist masking and etching. A fourth polysilicon layer 18 is then deposited and patterned to form the TFT channel layer 18 over the G1 gate electrode and makes contact to the G2 gate electrode in opening 2, as shown in FIG. 4. The layer 18 is then implanted with a P-type dopant through a patterned photoresist mask to form the source and drain areas of the P-channel TFT and at the same time forming an electrical connection from the drain 20 of the TFT, which is also the node point Q1 (FIG. 1) to the gate G2. Now as shown in FIG. 5, a second insulating layer 22 is deposited on the SRAM structure. A second opening is made in layer 22 for the first metal contact plugs. The metal plug is usually formed from a barrier metal such as tungsten. A first metal layer 26 is then deposited and patterned to form the first level of interconnections on the SRAM integrated circuit. Although the metal contact is shown adjacent to the gate G2 contact for clearer visualization, it should be understood that the metal contact plug is formed to any area on the substrate where an electrical contact is required.

There are a number of concerns with the prior art structure and process which degrade the performance and reliability of the SRAM. For example, during the etching of the contact opening 2, photoresist is in direct contact with the gate oxide and can introduce contaminants such as sodium into the oxide resulting in unstable device properties. And still another serious problem is the $P^+/N^+$ junction formed by the stacked contact between the doped polysilicon layers 14 and 18 in the contact opening 2. Although the dopant concentrations are high, the junctions still have diode characteristic which reduce the on current ($I_{on}$) when the SRAM cell is switches to the opposite state. Ideally, one would prefer a low resistance ohmic stacked contact.

Therefore, there is a strong need in the semiconductor industry for improved structures and processes for making thin film transistors for SRAMs and other integrate circuits that do not have the above problems, and is cost effective.

SUMMARY OF THE INVENTION

It is a principle object of this invention to provide a process for simultaneously forming low resistance ohmic $N^+/P^+$ stacked contacts and metal contacts on SRAMs having thin film transistors (TFT), and thereby improving the SRAM performance by increasing the on current and the ($I_{on}/I_{off}$) ratio.

It is another object of this invention to provide a process that avoids contamination of the TFT FET gate oxide and thereby improve the stability of the thin film transistor.

It is still another object of this invention to provide this improved low resistance ohmic stacked contacts and metal contacts using a reduced mask set, and thereby provide a cost effective manufacturing process.

In accordance with the objects of this invention a method for fabricating a novel plug structure on a SRAM cell is described. The method forms the stacked contact and the metal contact simultaneously by merging the process steps. The method starts by providing a P-type (boron) doped single crystal semiconductor substrate having device areas on the substrate surface, and surrounded by electrically isolating field oxide (FOX) areas. N-channel field effect transistors (pass transistor) having gate electrodes and interconnecting word lines are formed from a first polysilicon layer in the device areas. Source/drain areas are then formed and a second polysilicon layer N-doped is patterned to contact one of the source/drain area on each pass transistor. Two P-channel thin film transistor (TFT) are then formed on a first insulating layer in each cell area of the SRAM. The TFT are formed by depositing a third polysilicon layer doped $N^+$ with an N type dopant, such as arsenic or phosphorus, and patterned to form the gate electrodes of the two P-channel thin film transistors. A second insulating layer is deposited to form the gate oxide over the gate electrodes. A lightly $N^-$ doped amorphous polysilicon layer is deposited over the gate oxide layer and then selectively implanted with a P type impurity, such as boron, to form the TFT source/drain areas adjacent to the gate electrodes. The amorphous silicon layer is mask from P doped implantation over the areas where the two TFT are to be formed. Elsewhere over the gate electrodes the amorphous silicon layer is $P^+$ doped. The amorphous silicon layer is patterned by masking and etching to form the lightly N_ doped FET silicon channel over portion of each of the gate electrode having $P^+$ source/drains. The patterned P+ conducting silicon layer of each TFT also extends over a portion of the other TFT gate electrode, and provide a means of forming a stacked contact to connect the drain of one TFT to the gate electrode of the other TFT. The stacked contacts and the metal contact are now formed simultaneously by first etching openings in the patterned P+ amorphous silicon layer that extends over the gate electrode areas of each TFT. A third insulating layer is deposited and contact opening are anisotropically etched in the insulator over and aligned to the openings in the amorphous silicon layer. The openings are etched to the P+ doped portion of the surface of the amorphous silicon layer and further, the second insulating layer (gate oxide) is etched in the amorphous silicon layer openings to the surface of the N+ third polysilicon layer. The above masking and etching is simultaneously used to form the metal contact openings to the other device areas for electrical interconnections, thereby reducing the masking levels by one masking step over the prior art. Conducting plugs are formed in the openings, for example, by depositing a refractory metal, such as tungsten, and etching back to the surface of the third insulating layer. The SRAM is then completed to the first metal wiring level by depositing a metal, such as aluminium and patterning to form the interconnections. The metal plug in the stacked contact opening shorts the $P^+/N^+$ junction forming a good low resistance ohmic contact.

BRIEF DESCRIPTION OF THE DRAWINGS

The objects and other advantages of the invention will become more apparent in the preferred embodiment when read in conjunction with the following drawings.

FIG. 1 shows an electrical schematic of a prior art six transistor SRAM cell.

FIGS. 2 through 5 show schematic cross sectional views of the prior art for a portion of a SRAM cell having a reverse P-channel thin film transistor (TFT) and a conventional $P^+/N^+$ stacked contact with $P^+/N^+$ junctions.

FIGS. 6 through 9 show schematic cross sectional views for a portion of a SRAM cell having a P-channel thin film transistor (TFT) of this invention having low resistance ohmic stacked contacts and a metal contacts formed simultaneously.

DESCRIPTION OF THE PREFERRED EMBODIMENTS

Figure 7:
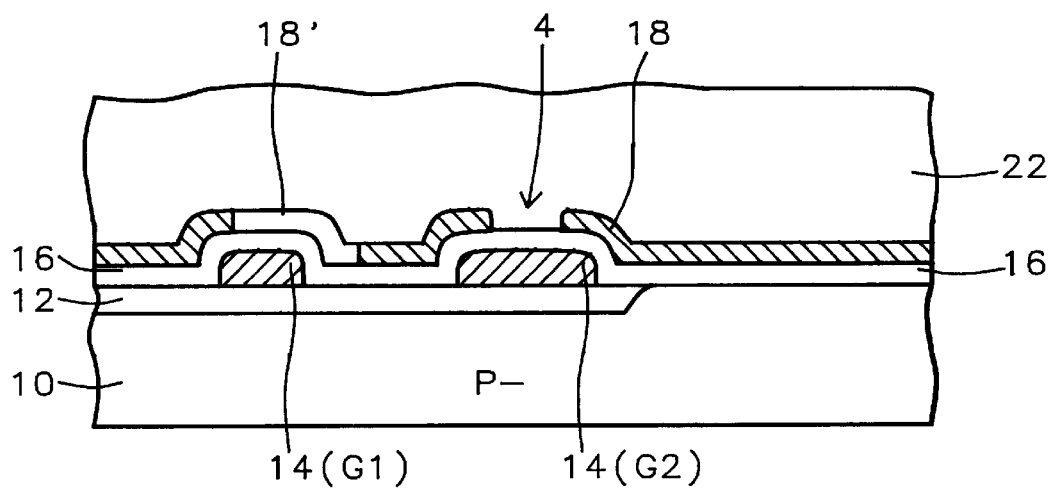

The present invention relates to the formation of an improved stacked contact on a SRAM cell having P-channel thin film transistors (TFT) and the simultaneous formation of metal contacts by merging two of the masking steps. However, it should be well understood by those killed in the art that the method can be equally applied to other semiconductor integrated circuits using P-channel TFT where low resistance ohmic stacked contacts are required between doped silicon layers having different conductivity type dopants.

To better understand the present invention for making the novel plug structure, a brief description is given of the fabrication of a SRAM cell. The complete SRAM cell is not shown in the cross section views of the FIGS. 6–9, but the device elements are depicted in the electrical schematic of FIG. 1. The SRAM is formed on a semiconductor substrate, such as on a $P^-$ doped single crystal silicon substrate. Device areas are formed for an array of N-channel pass transistors. Two of the transistors WN1 and WN2 are depicted in the SRAM cell of FIG. 1. Typically, the electrically isolated device areas are formed by selectively oxidizing the regions around the device areas, for example, by using a conventional LOCal Oxidation of Silicon (LOCOS) process. The pass transistors are formed by growing a gate oxide on the device areas and then using a patterned first polysilicon layer to form the field effect transistor gate electrodes and the word lines (one word line WL is depicted in FIG. 1). Source/drain areas are implanted adjacent to the gate electrodes and the gate electrodes are electrical insulated from a second polysilicon layer which is then patterned to form the bit lines (two bit lines BL1 and BL2 are depicted also in FIG. 1) that contact one of the two source/drain areas of the pass transistors WN1 and WN2. The other source/drain areas of each transistor is later connect to the nodes Q1 and Q2 of the SRAM latch portion of the circuit. The latch circuit is formed from CMOS FET devices consisting of two P-channel thin film transistors P1 and P2 and two N-channel transistors N1 and N2 having gate electrodes G1 and G2, as depicted in FIG. 1. The gate electrodes of the N1 and N2 transistors, also referred to as driver transistors, are also formed from the same first polysilicon layer as the pass transistor gate electrodes. The second polysilicon layer is used to form the driver transistor N1 and N2 source ground plate to provide the $v_{SS}$ ground contact, as indicated in FIG. 1.

Referring now to FIGS. 6 through 9, the embodiment of this invention is described in detail for the formation of the P-channel thin film transistors and more specifically the method for making the novel plug structure and the metal contacts on the latch portion of the SRAM circuit.

Referring first to FIGS. 6, shown in schematic cross sectional view is a portion of the $P^-$ silicon substrate 10 in the SRAM cell region. Shown is one of the P-channel thin film transistor (TFT) P1 and a portion of the gate electrode G2 of the second TFT P2. Also shown is a portion on the right side of the substrate 10 where a metal contact will be made to one of the substrate to contact a previously formed device in the device area. The device in the substrate is not shown to simplify the drawing. A first insulating 12 formed on substrate 10 by an earlier process step provides electrical isolation for the TFT from the substrate 10. The method of making the P-channel TFTs having the novel plug process is now described starting with FIG. 6.

Still referring to FIG. 6, a third polysilicon layer 14 is deposited on the substrate and patterned using conventional photolithographic methods and plasma etching to form the gate electrodes G1 and G2 for the two thin film transistors (TFT). The gate electrodes formed from the third polysilicon layer contact the gate electrodes of the driver transistors formed from the first polysilicon layer by means of a stacked contact. The layer 14 is preferable deposited by low pressure chemical vapor deposition (LPCVD) using, for example, a reactant gas containing silane ($SiH_4$), and the preferred thickness of polysilicon layer 14 is between about 300 to 1500 Angstroms. The polysilicon layer 14 is then doped with an N type dopant such as arsenic ($As^{75}$) or phosphorus ($p^{31}$) by ion implantation or alternatively, the layer 14 can be in situ doped by adding a dopant, such as phosphine ($PH_3$) during the CVD deposition. The preferred dopant concentration in layer 14 is between about 1.0 E 18 to 1.0 E 20 atoms/$cm^3$.

The polysilicon layer 14 is then patterned using conventional photolithographic techniques and anisotropic plasma etching to define the gate electrode regions G1 and G2, as shown in FIG. 6. The preferred anisotropic etching, for example, can be performed in a reactive ion etcher (RIE) using a gas mixture, for example, containing a chlorine containing gas species and using a carrier gas such as argon.

A second insulating layer 16, also shown in FIG. 6, is deposited next over the gate electrodes G1 and G2 formed from the patterned layer 14. This layer 16 serves as the gate oxide for the thin film transistors. The preferred deposition is carried out in a high temperature (about 800° C.) LPCVD system using a gas mixture of, for example, composed of dichloromethane ($SiH_2Cl_2$) and nitrous oxide ($N_2O$). The gate oxide is relatively thin. For example, the preferred thickness of the second insulating layer 16 is between about 50 to 500 Angstroms.

A relatively thin amorphous silicon layer 18, also shown in FIG. 6, is then deposited over the gate oxide layer 16 to provide a channel layer for the thin film transistors. The amorphous silicon layer is usually achieved by a low temperature CVD deposition For example, the amorphous layer 18 is typically deposited by LPCVD using a reactant gas containing silane ($SiH_4$) or a higher hydride of silicon, such as disilane ($Si_2H_6$), and having a preferred deposition temperature is in a range of between about 450 to 560° C. The preferred thickness of layer 18 is between about 50 to 800 Angstroms. Typically, the amorphous silicon layer is lightly doped with an N-type dopant, such as arsenic (As) or phosphorus (P) to prevent inversion when the P-channel TFT is in a nonconducting state (off) and to provide for the P+/N− junctions between the TFT FET channel and the source/drain areas. The N type dopant is typically achieved by ion implantation of arsenic ($As^{75}$) of phosphorus ($p^{31}$) and the preferred concentration in layer 18 is typically between about 1.0 E 16 to 1.0 E 18 atoms/$cm^3$.

One important advantage of this invention over the prior art, is that contact openings are not formed in the TFT gate oxide, as shown in FIG. 3 for the prior art. This eliminates the exposure of the gate oxide to a photoresist masking which is known in the semiconductor industry to contaminated the gate oxide. This contamination, such as sodium (Na), can create device electrical instabilities when the circuit is powered on.

Still referring to FIG. 6, A patterned photoresist implant mask 15 is now formed on layer 18 to mask portions of layer 18 over the gate electrodes where the channels for the TFTs are required. The mask portion for one of the TFT having the gate electrode Gi is shown in FIG. 1 labeled 18'. The amorphous silicon layer 18 is now subjected to an ion implantation using a P type dopant, for example, using a boron 11 ($B^{11}$). This ion implant forms the source/drain doped regions of the P-channel TFTS, and also provide a conducting layer elsewhere on the substrate. The implant mask 15 is shown for only the TFT having the gate electrode labeled G1 in FIG. 6. The cross section through the second gate electrode G2 is through an area not having a channel region and therefore has a $P_+$ doped portion of layer 18 extending over the gate electrode G2. A typical boron (B11) dopant concentration in layer 18, after ion implantation, is between about 1.0 E 18 to 1.0 E 20 atoms/$cm^3$.

Referring now to FIG. 7, the next sequence of process steps are shown. Using a photoresist mask (not shown) and plasma etching, the amorphous silicon layer 18 is patterned to define the P+ doped conducting stripes, also labeled 18 in FIG. 7. The patterning step also defining the channel width over the TFT gate electrodes. The channel layer 18' over the gate electrode G1 is shown in FIG. 7. The patterned P+ doped conducting stripe also extends over the a portion of the G2 gate electrode of the other TFT, as shown in FIG. 7. An important feature of the invention, is the simultaneously formation of the opening 4 in layer 18 to the gate oxide layer 16 over a portion of gate electrode G2. The etching is preferable done in a reactive ion etcher or other high plasma density etcher using a selective and anisotropic etch. For example, a gas mixture containing chlorine ($Cl_2$) or dichlorodifluoromethane ($CCl_2F_2$) with a carrier gas, such as argon (Ar), can be used.

A third insulating layer 22 is deposited over the patterned layer 18, as also shown in FIG. 7. Preferably the insulating layer is composed of a low flow glass to provide a leveling effect for planarizing the surface. For example, layer 22 can be deposited by low pressure chemical vapor deposition (LPCVD) reactor by decomposing a tetraethosiloxane (TEOS) while introducing dopants such as phosphine ($PH_3$) and diborane(6) ($B_2H_6$) to form the BPTEOS glass. The glass is then annealed for about between 15 to 60 minutes at a temperature of between about 800 to 900° C. to level the glass layer 22. The layer also serves as a barrier layer to sodium (Na) contamination.

Figure 8:
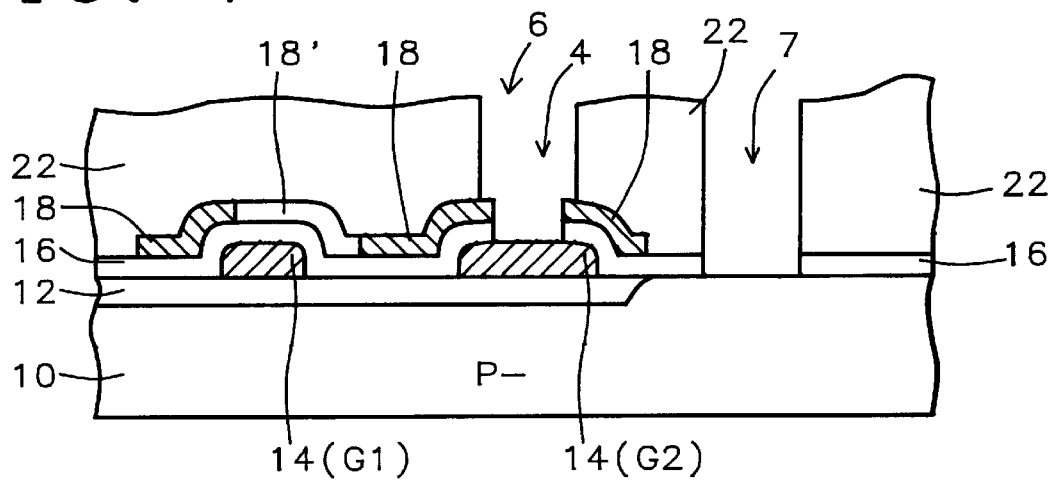

Referring now to FIG. 8, a second opening 6 is form in the third insulating layer 22, by conventional photolithographic techniques an anisotropic etching. The second opening is aligned over and is larger in size (width) than the opening 4 in the amorphous silicon layer 18. The preferred etching is accomplished in a reactive ion etcher using an etch gas mixture that has a high etch rate selectivity of silicon oxide to silicon. For example, the etching can be accomplished in a carbon tetrafluoride ($CF_4$) containing a hydrogen gas ($H_2$) or alternatively in a gas mixture containing trifluoromethane ($CHF_3$). The preferred etch rate selectivity of silicon oxide to silicon being greater than about 30 to 1.

As shown in FIG. 8, the opening 6 in layer 22 (BPTEOS) is etched to the surface of the amorphous silicon layer 18 and then further etched, utilizing the high selective etch masking advantage of layer 18 to etch the gate oxide 16 in opening 4 to the surface of the gate electrode layer 14 (G2), which itself provides an excellent etch stop, being composed of the third polysilicon layer 14. This then forms the stacked contact opening to the $P^+$ and $N^+$ layers 18 and 14 respectively.

Simultaneously, and using the same masking level a second set of openings 7 are etched in the insulating layer 22 to from the metal contact openings to the other device on the substrate in the device areas. This as mention earlier eliminates one of the masking levels from the prior art.

Figure 9:
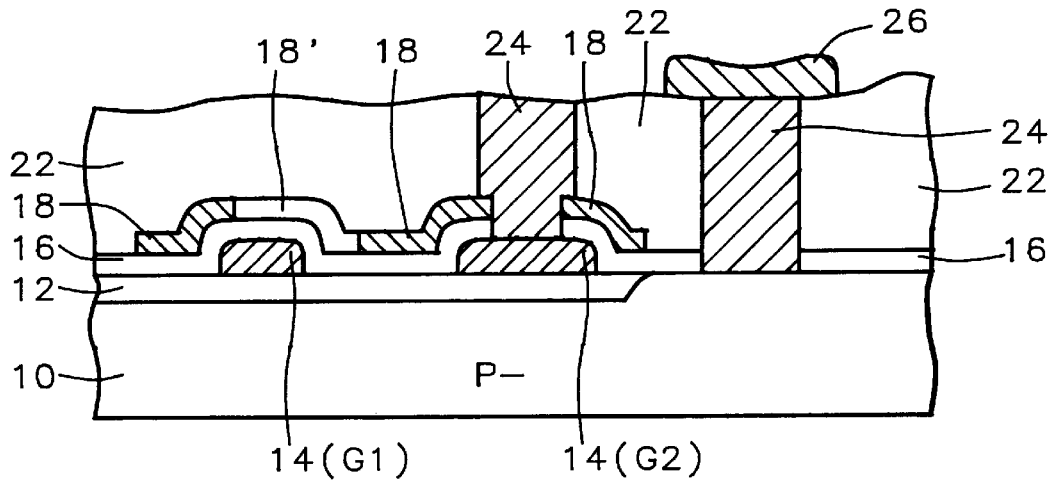

Referring now to FIG. 9, The novel plug structure is completed by depositing a metal layer 24 to conformally fill the openings 6 and 7 and thereby making an electrical contact between the P+ and N+ layers 14 and 18 in opening 6 and simultaneously making electrical contact to the terminals of the other devices on the substrate in openings 7. The metal layer 24 is then etched back to form the electrically isolated conductive plugs 24 in each contact opening, as shown in FIG. 9. The conductive plugs 24 are preferably composed of a refractory metal, such as tungsten (W), which also functions as a barrier layer to metal penetration from the first metal layer into the silicon contacts on the substrate. The tungsten can be deposited by several methods, such as CVD, physical evaporation, sputtering and the likes, but is preferably accomplished by using CVD and the thermal decomposition of tungsten hexafluoride ($WF_6$). FIG. 9 shows the SRAM completed up to the first level metal 26. For example, an aluminium layer 26 can be deposited and then patterned by photoresist masking an plasma etching to form the first metal interconnect level.

To simplify the description of the invention FIGS. 6 through 9 show the formation of only one electrical connection between the drain (node Q1 FIG. 1) of the first TFT having gate electrode G1 to the gate G2 of the second TFT. However, it should be noted that during the processing a second connection is made from the drain (node Q2 FIG. 1) of the second TFT to the gate electrode GI of the first TFT. Both connections are made through stacked contacts between the $P^+$ and $N^+$ layers 18 and 14 using metal plugs that electrically short the $P^+/N^+$ junction and provide a very low resistance ohmic contact, which is a significant improvement over the stacked contacts of the prior art of FIGS. 2 through 5.

While the invention has been particularly shown and described with reference to the preferred embodiments thereof, it will be understood by those skilled in the art that various changes in form and details may be made without departing from the spirit and scope of the invention. For example, although the embodiment describes making improved stacked contacts for SRAM circuits, it should also be understood that these improved ohmic contacts can also be made on other semiconductor integrated circuits that requiring low resistance ohmic contacts between $P^+$ to $N^+$ silicon layers and requiring also metal contacts to other devices on the same substrate.

What is claimed is:

1. A novel plug structure for stacked contacts and metal contacts on a Static Random Access Memory (SRAM) cell having thin film transistors, on a partially completed semiconductor substrate having device areas and field oxide areas and further having field effect transistors (FETs) and word lines formed from a first polysilicon layer and Vss ground plate formed from a second polysilicon layer comprising of:

a first insulating layer on said substrate;

a patterned $N^+$ doped third polysilicon layer on said first insulating layer forming first and second gate electrodes for a first and second thin film transistor;

a second insulating layer forming a gate oxide on said first and second gate electrodes;

a patterned N type amorphous silicon layer on said second insulating layer with $P^+$ doped areas over said first and second gate electrodes and with undoped $P^+$ type areas for channel regions on said first and second thin film transistors; and said channel regions contiguous with said P-doped areas and said P-doped areas extending over areas of the other said gate electrode and on said second insulating layer;

said patterned N type amorphous silicon layer having openings in said P-doped areas of said amorphous polysilicon layer over said other gate electrode area and to said second insulating layer;

a third insulating layer over said patterned N type amorphous silicon layer having openings aligned over and larger in size than said openings in said P doped portions of said amorphous silicon layer, said third insulating layer openings extending to said amorphous layer and further to said third polysilicon layer, and said third insulating layer having other openings to device areas elsewhere on said substrate;

conducting plugs in said third insulating layer openings and thereby having low resistance ohmic stacked contacts for said thin film transistors and other conducting plugs in said other openings elsewhere to device areas on said substrate;

a patterned first metal layer forming electrical interconnections, and thereby having said novel plug structure on said SRAM cell.

2. The plug structure of claim 1, wherein the conducting plug in said stacked contact openings electrically shorts the P/N junction between said P doped amorphous silicon layer and said N doped third polysilicon layer, thereby forming a low resistance ohmic contact.

3. The plug structure of claim 1, wherein said conducting plugs are tungsten metal formed by chemical vapor deposition (CVD) in a tungsten hexefluoride ($WF_6$) reactant gas and etch back to said third insulating layer surface by plasma etching in an etch gas of carbon tetraflouride ($CF_4$).

4. The plug structure of claim 1, wherein said conducting plugs electrically connects the drain of said first thin film transistor (TFT) to said gate electrode of said second TFT, and concurrently connects the drain of said second TFT to said gate electrode of said first TFT.

5. The plug structure of claim 1 wherein said stacked contacts and said metal contacts are simultaneously formed.

* * * * *

UNITED STATES PATENT AND TRADEMARK OFFICE
CERTIFICATE OF CORRECTION

PATENT NO. : 6,222,214 B1
DATED : April 24, 2001
INVENTOR(S) : Shou-Gwo Wuu, Mong-Song Liang, Chung-Hui Su, Chen-Jong Wang It is certified that error appears in the above-identified patent and that said Letters Patent is hereby corrected as shown below:

Title page,
Item [54], add "Having" to the Title so that it reads: -- A Novel Plug Structure and Process for Forming Stacked Contacts and Metal Contacts on Static Random Access Memory Having Thin Film Transistors --

Signed and Sealed this

Sixteenth Day of October, 2001

Attest:

NICHOLAS P. GODICI
Attesting Officer    Acting Director of the United States Patent and Trademark Office